(12) United States Patent
Kalinin et al.

(10) Patent No.: US 11,518,674 B2
(45) Date of Patent: Dec. 6, 2022

(54) ATOMIC-SCALE E-BEAM SCULPTOR

(71) Applicant: UT-Battelle, LLC, Oak Ridge, TN (US)

(72) Inventors: Sergei V. Kalinin, Oak Ridge, TN (US); Stephen Jesse, Oak Ridge, TN (US); Albina Y. Borisevich, Oak Ridge, TN (US); Ondrej E. Dyck, Oak Ridge, TN (US); Bobby G. Sumpter, Oak Ridge, TN (US); Raymond R. Unocic, Oak Ridge, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 550 days.

(21) Appl. No.: 16/780,561

(22) Filed: Feb. 3, 2020

(65) Prior Publication Data
US 2020/0247667 A1  Aug. 6, 2020

Related U.S. Application Data

(60) Provisional application No. 62/800,759, filed on Feb. 4, 2019.

(51) Int. Cl.
*H01J 37/317* (2006.01)
*G03F 7/20* (2006.01)
(Continued)

(52) U.S. Cl.
CPC ...... *B81C 99/0065* (2013.01); *B81C 1/00492* (2013.01); *G03F 7/2059* (2013.01);
(Continued)

(58) Field of Classification Search
CPC .................... H01J 37/3174; G03F 7/2059
See application file for complete search history.

(56) References Cited

U.S. PATENT DOCUMENTS

| 2004/0113097 A1* | 6/2004 | Marchman | .......... H01J 37/3056 |
| | | | 250/492.2 |
| 2015/0076350 A1* | 3/2015 | Plettner | ................. H01J 37/304 |
| | | | 250/336.1 |

(Continued)

OTHER PUBLICATIONS

D.M. Eigler and E. K. Schweizer, Positioning Single Atoms with a Scanning Tunnelling Microscope, Nature 344 (6266), 524-526 (1990).

(Continued)

*Primary Examiner* — Sean M Luck
(74) *Attorney, Agent, or Firm* — Lempia Summerfield Katz LLC

(57) ABSTRACT

A system and method (referred to as the system) fabricates controllable atomic assemblies in two and three dimensions. The systems identify by a non-invasive imager, a local atomic structure, distribution of vacancies, and dopant atoms and modify, by a microscopic modifier, the local atomic structure, via electron beam irradiation. The systems store, by a knowledge base, cause-and-effect relationships based on a non-invasive imaging and electron scans. The systems detect, by detectors, changes in the local atomic structure induced by the electron irradiation; and fabricate, a modified atomic structure by a beam control software and feedback.

20 Claims, 15 Drawing Sheets
(12 of 15 Drawing Sheet(s) Filed in Color)

(51) Int. Cl.
   *B81C 99/00* (2010.01)
   *B81C 1/00* (2006.01)
   *B82Y 40/00* (2011.01)
(52) U.S. Cl.
   CPC .. *H01J 37/3174* (2013.01); *B81C 2201/0102* (2013.01); *B81C 2201/0156* (2013.01); *B82Y 40/00* (2013.01)

(56) References Cited

U.S. PATENT DOCUMENTS

2019/0108982 A1* 4/2019 Yang ............... H01L 29/66795
2019/0187570 A1* 6/2019 Mack ................... H01J 37/222

OTHER PUBLICATIONS

C. Tourney, 35 Atoms That Changed the Nanoworld, Naure Nonotechnology 5 (4), 239-241 (2010).
M.F. Crommie, C.P. Lutz and D.M. Eigler, Confinement of Electrons to Quantum Corrals on a Metal Surface, Science 262 (5131), 218-220 (1993).
M.F. Crommie, C.P. Lutz and D.M. Eigler, Imaging Standing Waves in a Two-Dimensional Electron Gas, Nature 363 (6429), 524-527 (1993).
D.M. Eigler, C.P. Lutz and W.E. Rudge, An Atomic Switch Realized With the Scanning Tunnelling Microscope, Nature 352 (6336), 600-603 (1991).
A. J. Heinrich, C.P. Lutz, J.A. Gupta and D.M. Eigler, Molecule Cascades, Science 298 (5597), 1381-1387 (2002).
C.R. Moon, C.P. Lutz and H.C. Manoharan, Single-Atom Gating of Quantum-State Superpositions, Nature Physics 4 (6) 454-458 (2008).
O. Custance, R. Perez and S. Morita, Atomic Force Microscopy as a Tool for Atom Manipulation, Nature Nanotechnology 4 (12) 803-810 (2009).
Y. Sugimoto, M. Abe, S. Hirayama, N. Oyabu, O. Custance and S. Morita, Atom Inlays Performed at Room Temperature Using Atomic Force Microscopy, Nature Materials 4 (2), 156-159 (2005).
A. Coskun, M. Banaszak, R. D. Astumian, J. F. Stoddart and B. A. Grzybowski, Great Expectations: Can Artificial Molecular Machines Deliver on their Promise?, Chem. Soc. Rev. 41 (1), 19-30 (2012).
W. R. Browne and B. L. Feringa, Making Molecular Machines Work, Nature Nanotechnology 1 (1) 25-35 (2006).
N. Ruangsupapichat, M. M. Pollard, S. R. Harutyunyan and B. L. Feringa, Reversing the Direction in a Light-Driven Rotary Molecular Motor, Nature Chemistry 3 (1), 53-60 (2011).
S. Saha and J. F. Stoddart, Photo-Driven Molecular Devices, Chem.Soc. Rev. 36 (1), 77-92 (2007).
S. P. Fletcher, F. Dumur, M. M. Pollard and B. L. Feringa, A Reversible, Unidirectional Molecular Rotary Motor Driven by Chemical Energy, Science 310 (5745), 80-82 (2005).
V. Balzani, M. Gomez-Lopez and J. F. Stoddart, Molecular Machines, Accounts Chem. Res. 31 (7), 405-414 (1998).
T. Kudernac, N. Ruangsupapichat, M. Parschau, B. Macia. N. Karsonis, S. R. Harutyunyan, K. H. Ernst and B. L. Feringa, Electrically Driven Directional Motion of a Four-Wheeled Molecule on a Metal Surface, Nature 479 (7372), 208-211 (2011).
S. Szumkuc, E. P. Gajewska, T. Klucznik, K. Molga, P. Dittwald, M. Startek, M. Bajczyk and B.A. Grzybowski, Angew. , Computer-Assisted Synthetic Planning: The End of the Beginning, Chem—Int. Edit. 55 (20), 5904-5937 (2016).
A. Cadeddu, E. K. Wylie, J. Jurczak, M. Wampler-Doty and B.A. Grzybowski, Angew. Organic Chemistry as a Language and the Implications of Chemicals Linguistics for Structural and Retrosynthetic Analyses, Chem.-Int. Edit. 53 (31), 8108-8112 (2014).
C. Vieu, F. Carcenac, A. Pepin, Y. Chen, M. Mejias, A. Lebib, L. Manin-Ferlazzo, L. Couraud and H. Launois, Electron Bean Lithography: Resolution Limits and Applications, Applied Surface Science 164, 111-117 (2000).

S. Dai, J. Zhao, L. Xie, Y. Cai, N. Wang and J. Zhu, Electron-Beam-Inducted Elastic-Plastic Transition in Si Nanowires, Nano Letters 12 (5), 2379-2385 (2012).
D. Amkreutz, J. Muller, M. Schmidt, T. Hanel and T. F. Schulze, Electron-Beam Crystallized Large Grained Silicon Solar Cell on Glass Substrate, Prog Photovoltaics 19 (8), 937-945 (2011).
Z. L. Wang, N. Itoh, N. Matsunami and Q. T. Zhao, Ion-induced Crystallization and Amorphization at Crystal/Amorphous Interfaces of Silicon, Nucl. Instrum. Methods Phys. Res. Sect. B-Beam Interact. Mater. Atoms 100 (4), 493-501 (1995).
I. Jencic, M. W. Bench, I. M. Robertson and M. A. Kirk, Electron-Beam-Induced Crystallization of Isolated Amorphous Regions in Si, Ge, GaP, and GaA, Journal of Applied Physics 78 (2), 974-982 (1995).
X. X. Yang, R. H. Wang, H. P. Yan and Z. Zhang, Low Energy Electron-Beam-Induced Recrystallization of Continuous GaAs Amorphous Foils, Mater. Sci. Eng. B—Solid State Mater. Adv. Technol. 49 (1), 5-13 (1997).
Z. C. Li, L. Liu, L. L. He and Y.B. Xu, Electron-Beam Inducted Nucleation and Growth in Amorphous GaAs, Acta Metall, Sin. 39 (1), 13-16 (2003).
C. O. Girit, J. C. Meyer, R. Erni, M. D. Rossell, C. Kisielowski, L. Yang, C. H. Park, M. F. Crommie, M. L. Cohen, S. G. Louie and A. Zettl, Graphene at the Edge: Stability and Dynamics, Science 323 (5922), 1705-1708 (2009).
M. D. Fischbein and M. Drndic, Electron Beam Nanosculpting of Suspended Graphene Sheets, Applied Physics Letters 93 (11), 113107 (2008).
B. Song, G. F. Schneider, Q. Xu, G. Pandraud, C. Dekker and H. Zandbergen, Atomic-Scale Electron-Beam Sculpting of Near-Defect-Free Graphene Nanostructures, Nano Letters 11 (6), 2247-2250 (2011).
J. Lin, O. Cretu, W. Zhou, K. Suenaga, D. Prasai, K. I. Bolotin, N. T. Cuong, M. Otani, S. Okada, A. R. Luipini, J.-C. Idrobo, D. Caudel, A. Burger, N. J. Ghimire, J. Yan, D. G. Mandrus, S. J. Pennycook and S. T. Pantelides, Nat Nano 9 (6), 436-442 (2014).
W. F. v. Dorp, X. Zhang, B. L. Feringa, J. B. Wagner, T. W. Hansen and J. T. M. D. Hosson, Nanometer-Scale Lithography on Microscopically Clean Graphene, Nanotechnology 22 (50), 505303 (2011).
K. Zheng, C. Wang, Y.-Q. Cheng, Y. Yue, X. Han, Z. Zhang, Z. Shan, S. X. Mao, M. Ye, Y. Yin and E. Ma, Electron-Beam-Assisted Superplastic Shaping of Nanoscale Amorphous Silica, Nat Commun 1. 24 (2010).
J. C. M. Toma Susi, Jani Kotakoski, Manipulating Low-Dimensional Materials Down to the Level of Single Atoms With Electron Irradiation, Ultramicroscopy 180, 163-172 (2017).
C. Vieu, F. Carcenac, A. Pepin, Y. Chen, M. Mejias, A. Lebib, L. Manin-Ferlazzo, L. Couraud and H. Launois, Electron Beam Lithography: Resolution Limits and Applications, Applied Surface Science 164, 111-1117 (2000).
S. Dai, J. Zhao, L. Xie, Y. Cai, N. Wang and J. Zhu, Electron-Beam-Inducted Elastic-Plastic Transition in Si Nanowires, Nano Letters 12 (5), 2379-2385 (2012).
Z. L. Wang, N. Itoh, N. Matsunami and Q. T. Zhao, Ion-Induced Crystallization and amorphization at Crystal/Amorphous Interfaces of Silicon, Nucl. Instrum. Methods Phys. Res. Sect. B-Beam Interact. Mater. Atoms 100 (4), 493-501 (1995).
L. Jencic, M. W. Bench, I. M. Robertson and M. A. Kirk, Electron-Beam-Induced Crystallization of Isolated Amorphous Regions in Si, Ge, GaP, and GaAs, Journal of Applied Physics 78 (2), 974-982 (1995).
X. X. Yang, R. H. Wang, H. P. Yan and Z. Zhang, Low Energy Electron-Beam-Induced Recrystallization of Continuous GaAs Amorphous Foils, Mater, Sci Eng. B—Solid State Mater. Adv. Technol. 49 (1), 5-13 (1997).
Z. C. Li, L. Liu, L. L. He and Y. B. Xu, Electron-Beam Induced Nucleation and Growth in Amorphous GaAs, Acta Metall. Sin. 39 (1), 13-16 (2003).
K. Zheng, C. Wang, Y.-Q. Cheng, Y. Yue, Z. Han, Z. Zhang, Z. Shan, S. X. Mai, M. Ye, Y. Yin and E. Ma, Electron-Beam-Assisted Superplastic Shaping of Nanoscale Amorphous Silica, Nat Commun 1, 24 (2010).

(56) References Cited

OTHER PUBLICATIONS

C. O. Girit, J.C. Meyer, R. Emi, M. D. Rossell, C. Kisielowski, L. Yang, C. H. Park, M. F. Crommie, M. L. Cohen, S. G. Louie and A. Zettl, Graphene at the Edge: Stability and Dynamics, Science 323 (5922), 1705-1708 (2009).

J. Lin, O. Cretu, W. Zhou, K. Suenaga, D. Prasai, K. I. Bolotin, N. T. Cuong, M. Otani, S. Okada, A. R. Lupini, J.-C. Idrobo, D. Caudel, A. Burger, N. J. Ghimire, J. Yan, D. G. Mandrus, S. J. Pennycook and S. T. Pantelides, Nat Nano 9 (6), 436-442 (2014).

A. Meldrum, L. A. Boatner and R. C. Ewing, Electron-Irradiation-Induced Nucleation and Growth in Amorphous LaPO4, ScPO4, and Zircon, Journal of Materials Research 12 (7), 1816-1827 (1997).

Y. Zhang, J. Lian, C. M. Wang, W. Jiang, R. C. Ewing and W. J. Weber, Ion-Induced Damage Accumulation and Electron-Beam-Enhanced Recrystallization in SrTiO3, Physical Review B 72 (9), 094112 (2005).

F. Corticelli, G. Lulli and P. G. Merli, Philos. Solid-Phase Epitaxy of Implanted Silicon at Liquid Nitrogen and Room Temperature Induced by Electron Irradiation In the Electron Microscope, Mag. Lett. 61 (3), 101-106 (1990).

Z. C. Li, H. Zhang and Y. B. Xu, Direct Observation of Elecron-Beam-Induced Nucleation and Growth in Amorphous GaAs, Mater. Sci. Semicond. Process 7 (1-2), 19-25 (2004).

Y. Zhang, C. M. Wang, M. H. Engelhard and W. J. Weber, Irradiation Behavior of SrTiO3 at Temperatures Close to the Critical Temperature for Amorphization, Journal of Applied Physics 100 (11) (2006).

Y. Zhang, J. Lian, C. M. Wang, W. Jiang, R. C. Ewing and W. J. Weber, Ion-Induced Damage Accumulation and Electron-Beam-Enhanced Recrystallization in SrTiO3, Physical Review B 72 (9)(2005).

\* cited by examiner

ATOMIC-SCALE E-BEAM SCULPTOR

PRIORITY CLAIM

This application claims priority to U.S. Provisional Patent Application No. 62/800,759, titled Atomic-Scale E-Beam Sculptor filed Feb. 4, 2019, which is herein incorporated by reference.

STATEMENT REGARDING FEDERALLY SPONSORED RESEARCH AND DEVELOPMENT

The inventions were made with United States government support under Contract No. DE-AC05-00OR22725 awarded by the United States Department of Energy. The United States government has certain rights in the inventions.

BACKGROUND OF THE DISCLOSURE

Technical Field

This application relates to the fabrication of nanometer assemblies, and particularly to the fabrication of two and three dimensional atomic assemblies.

Related Art

The fabrication of nanometer assemblies on an atom-by-atom basis remains a long-held dream and the ultimate goal of nanotechnology. Despite this dream, the number of viable atomic fabrication processes is limited. One approach combines a scanning tunneling manipulation with surface chemistry. Generally, this approach is limited to modifying the surfaces of atomic structures. Further, the technology is costly, slow, and renders limited yields.

A second approach relies on chemical formulations. This approach uses a controlled chemical synthesis of molecular materials to render assemblies. This approach requires (1) the design of molecular blocks that can carry out functionalities; (2) the development of the synthetic pathway; and (3) the assembly of operational supramolecular structures, which generally make the technology impractical.

A third approach uses electron beam lithography. In electron beam lithography, a scanning electron beam fabricates structures. However, due to the finite interaction volume of lower-energy electron beams, assembly patterning at the atomic scale is not feasible.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The elements in the figures are not necessarily to scale, emphasis instead being placed upon illustrating the principles of the disclosure. Moreover, in the figures, like referenced numerals designate corresponding parts throughout the different views.

FIG. 1a is a controlled deposition of an amorphous carbon layer on a graphene lattice. FIG. 1b is a controlled deposition of multi-layer graphene structure on a graphene lattice. FIG. 1c shows the results of a controlled deposition. FIG. 1d shows the result of a conversion of the amorphous carbon deposition of FIG. 1c onto a multi-layer graphene/graphite structure upon heating.

FIG. 2a is an initial, pristine graphene lattice. FIG. 2b is the lattice of FIG. 2a after about a hole has been drilled. FIG. 2c is a screen-capture of the control software interface with representations of the last four spiral scans of the hole drilling process displayed in a window.

FIG. 3a is an original atomic configuration with a bright Si atom in the lower portion of the image and a target lattice site indicated with a red dot. FIGS. 3b-3f are images at various points in time as the Si atom is moved. The atom motion is indicated by the red, dotted line.

FIG. 5a shows the result when a 100 kV beam is placed on a lattice site where the dopant is to be placed. FIG. 5b shows a small hole or defect that is created by the beam exposure. FIG. 5c shows the lattice healing by incorporating a substitutional defect atom from a surrounding source material.

FIG. 6a shows the hole that is created with a focused scanning transmission electron microscope probe. FIG. 6b illustrates the result of the source material agitated with an electron beam by scanning over a small area. This acts to heal the graphene by incorporating the source materials in a graphene lattice. FIG. 6C shows the graphene lattice healed by integrating two silicon substitutional atoms from the source material.

FIG. 9a is a scanning transmission electron microscope image of crystal-amorphous interface and location of scan path during crystallization. FIG. 9b is a spatial domain plot and FIG. 9c is a Fourier domain plot of detector signal in the amorphous region. FIG. 9d is a spatial domain plot and FIG. 9e is a Fourier domain plot of a detector signal in the crystalline region. FIG. 9f is a plot of the peak amplitude from FIG. 9e as a function of time during directed crystal growth from a starting point within the crystal and while the CA front proceeds forward.

FIG. 11a is an image before growth and FIG. 11b is an image of the crystallization of amorphous silicon along the crystalline beam current.

FIG. 12a is a pre-growth image and its FFT. FIG. 12b is an abundance map and endmember one recovered through non-negative matrix factorization corresponding to the amorphous region. FIG. 12c is an abundance map and endmember two recovered through the non-negative matrix factorization corresponding to the crystalline region. FIG. 12d is an after-growth image and its FFT. FIG. 12e is an abundance map for the amorphous region in after-growth image generated using non-negative least squares process.

FIG. 12f is an abundance map for the crystalline region in after-growth image generated using non-negative least squares process.

DETAILED DESCRIPTION

Figure 1:
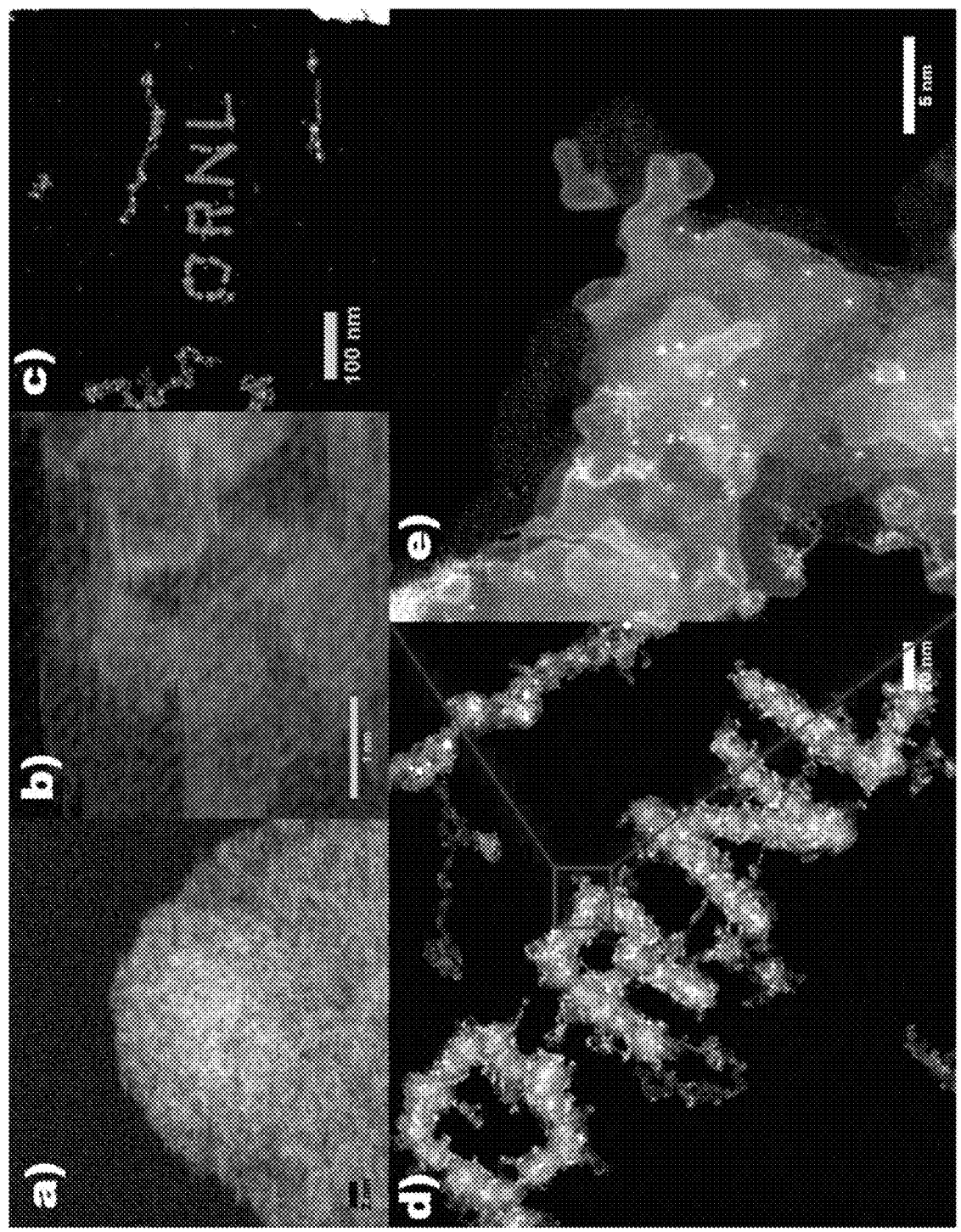
FIG. 1 is an image of a controlled deposition.

The disclosed systems and processes (referred to as systems) fabricate and pattern devices at the nanometer and atomic level scales. The systems create controllable atomic assemblies in two and three dimensions using a combination of the scanning transmission electron microscopy, electron beam modifications, customized beam controls, and real time feedback. Some real time feedback is based on single point feedback, diffraction feedback, sub-image feedback and/or the analysis of a chemical spectroscopy feedback. Some systems develop and apply cause-and-effect rules stored in a knowledge base to induce transformations that can be used on a customized fabrication scale or a commercial fabrication scale. The systems apply knowledge base algorithms to fabricate nanometer assemblies automatically.

Nanometer structures, assemblies, and/or modifications may be created through five illustrative workflows that may be executed, in part, by an electron beam source such as an electron beam generated by a scanning transmission electron microscope (STEM). In a first workflow, an overview of the material structure is captured that identify local crystallographic structures, the distribution of vacancies and dopant atoms, and the capture of other objects. Stage one captures one or multiple images, sample alignments, etc. through electron captures such as through electron microscopy.

In stage two of the workflow, macroscopic modifications are made to the target sample. These modifications may include the deposition of macroscopic contacts through an electron beam or lithography, material cleaning via heat, electron sources, light, and/or ion irradiations, the deposition of atoms via evaporation or the placement of large scale assemblies.

Since both stage one and stage two are used to prepare the system elements for fabrication, these stages are optional and may occur in any order. Other preparation may include the random or uncontrolled deposition of dopant atoms for a single atom or the application of a dopant front manipulation. It may also include an electron beam manipulation of the material to create defined geometry of defects through a beam cutting or the forming of mesoscopic contacts that interface functional atomic assemblies.

In stage 3 of the workflow, cause-and-effect relationships are established and stored in memory. In some applications, the cause-and-effect relationships re-executed to fabricate nanometer structures and/or assemblies are generate modifications to them. This stage comprises the steps:

A. Executing a non-invasive imaging. This step can occur through a low dose, compressed sensing or a more complex image-recognition.

B. Positioning an electron beam at a predefined location or locations or scanning an electron beam at predetermined trajectory. The trajectory may include but is not limited to spiral scans, a wobbling motion pattern scans in x and y coordinate directions, and focal depth changing scans.

C. Collecting signals related to the material structure scanned during stage 3, step B. This step is optional and may be used in material fabrications and/or modifications. In step C, the collected signals may include a scalar intensity signal detected via bright and dark field detectors, pixelated STEM detectors, electron energy loss spectrometers, etc. The signals can be reconstructed to render a dynamic object. For example, a dark field signal obtained during a spiral scan or other space-covering trajectory scans may be processed to render a sub-image.

D. Executing a non-invasive imaging. Like step A, the noninvasive imaging may be enabled through a low electron dose, compressed sensing, or a more complex image-recognition.

E. Identifying the changes in the atomic structure or organization induced by step B and correlating those identified changes to the signals detected at step C.

F. Positioning the electron beam at a predefined location or locations or scanning on a predetermined trajectory in different regions of the manipulation. Thereafter, the execution of steps A, B, D, E or steps A-E build and record the cause and effect relationship retained in memory. In stage 3, steps A-E establish changes in the materials structure induced by the electron scanning process shown in steps A, B, D, E, which are detected during scanning step C.

Once the cause and effect relationships are established and stored in memory, the manufacturability of desired atomic configuration from the atomic configurations detected at stage (1) is established at stage 4 of the workflow. The atomic configuration may be established through a directed or automated graphical search retained in cause and effect tables stored in memory, image and design inspection, or by the execution of other algorithms.

At stage 5 of the workflow, the electron beam fabricates the desired structure. The fabrication process may execute a:

A. point-by-point or line-by-line fabrication, where the desired changes are introduced in spatial location sequentially and the beam motion is controlled in part by the feedback signal is generated. The self-limiting and self-correcting process uses changes in output to control the point-by-point or line-by-line fabrication scans automatically.

B. A global process where a predefined trajectory is loaded into memory and executed by a process to execute an imaging before and after a structure fabrication.

C. Processes that identify changes in the atomic structure or the atomic organization induced by electron beam modifications to the structures and correlating those identified changes to signals detected from the structures. Based on the detected signals, self-corrections are executed by the fabricating algorithm.

In some systems, atomic fabrication, defect formation, and/or atomic movement are made by programs, routines, and software that automatically control the functioning of the hardware to controllably create atomic assemblies. In an exemplary process, the system initializes the controlling program that executes a rapid scan that detects atomic positions. The scan may have a low electron dose and may be non-invasive. At a next step, the controlling program execute a material manipulation, which can position a scanning beam such as an electron beam at given proximity to or directed to a single or multiple atoms through a spiral scan or snake like scan, etc., that approach the atom or atoms. This step determines what action the beam produces, such as for example, a repelling or an attraction occurrence. At a next step, the program may re-acquire or update the atom's position in memory and execute further atomic manipulations by applying the acquired knowledge that controls the beams behavior.

Nanoscale material and single atom control may render several structures. FIG. 1a shows the motion of a silicon (Si) atom's motion represented by the red, dotted line and FIG. 1b shows controlled depositions of amorphous and graphitic carbon on graphene, respectively. FIG. 1c illustrates how a STEM beam may be automatically controlled to render a pattern using feedback. FIGS. 1d and 1e show an initially amorphous carbon deposition that was graphitized by applying heat.

Figure 2:
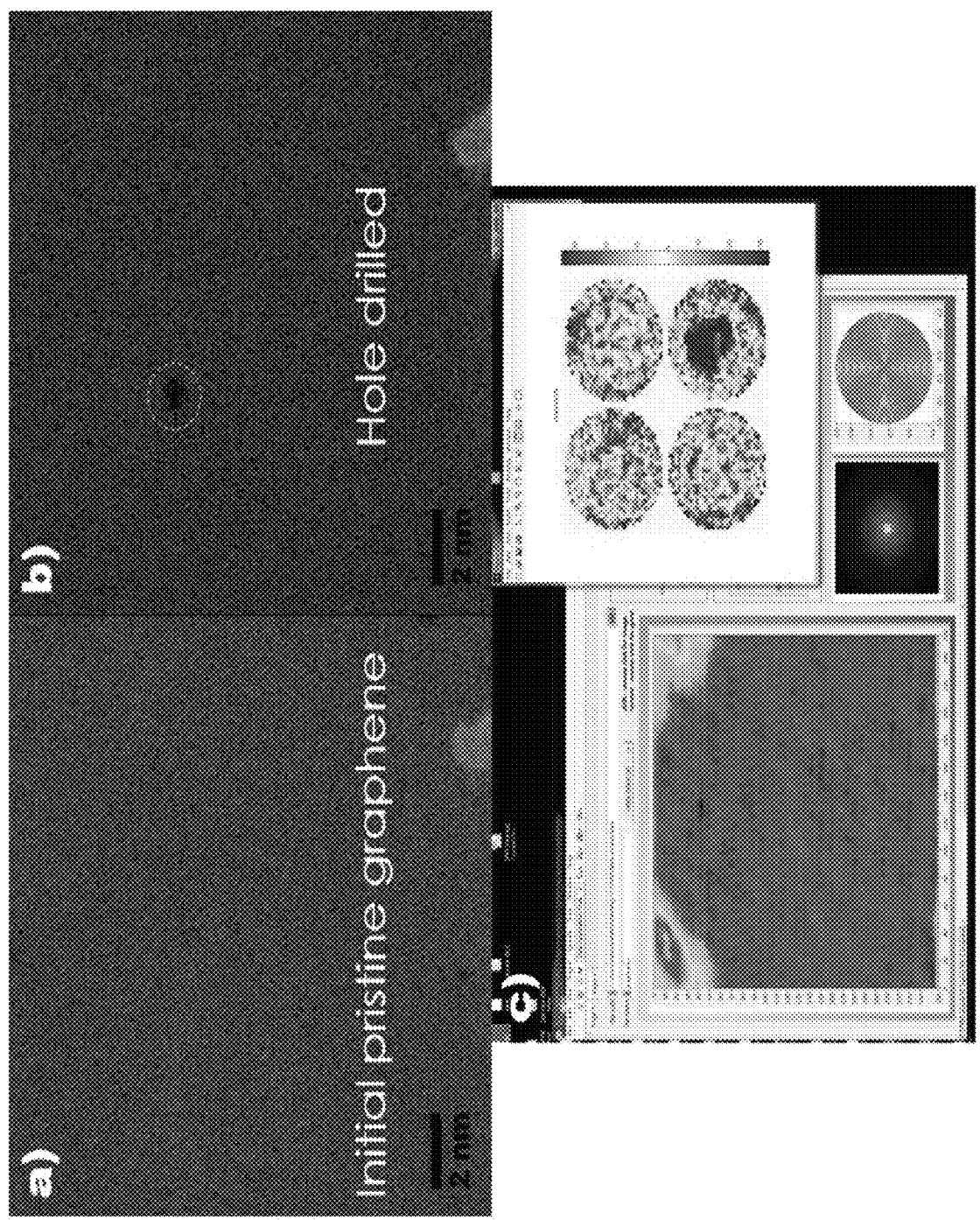
FIG. 2 is an image of a lattice.

By processing a portion of the systems output as input, the systems render precise atomic scale control. In FIG. 2, the system drilled a hole in a pure section of graphene. FIG. 2a shows a pristine graphene lattice. FIG. 2b shows the lattice after the hole was drilled by an electron beam. FIG. 2c shows a screen capture of the custom beam control software. In FIG. 2, software processes the output from a medium angle annular dark field (MAADF) detector. The four spherical images shown in the lower right portion of the figure represents the results of four electronic scans executed by a STEM showing the different stages of the formation of the hole. The illustrations appear circular because the electron beam scanned in a spiral motion around the lattice site to create the hole. In the final scan (shown on the lower right side of FIG. 2) the hole is formed, which causes the software to terminate the electron beam to prevent the hole from widening.

Figure 3:
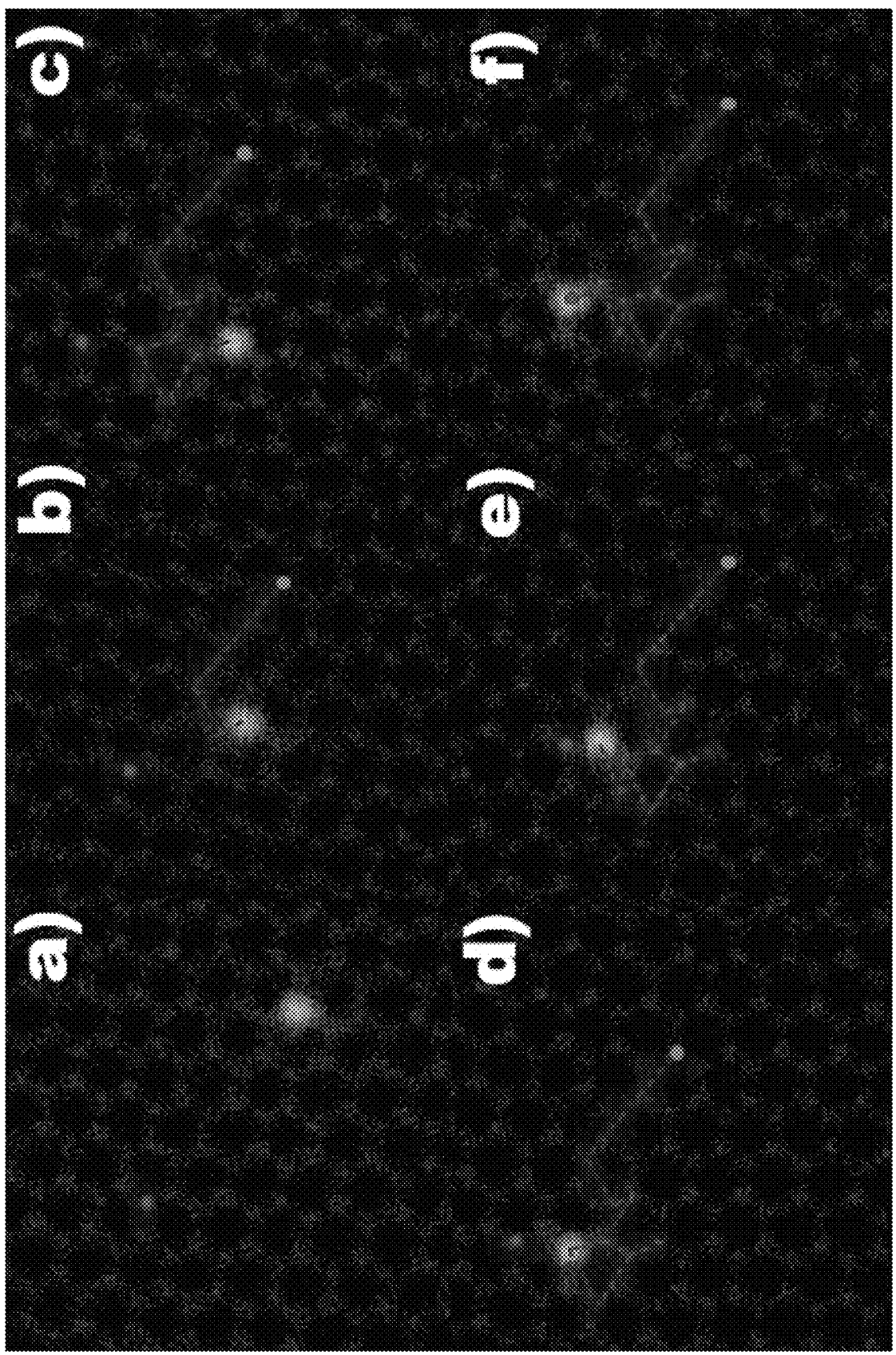
FIG. 3 is an atomic configuration.

FIG. 3 illustrates an exemplary control of a single atom within a single layer graphene lattice. To move a Si substitutional atom within the lattice, a 60 kV electron beam scanned over a small sub-region. The Si atom is the bright spot on the drawing. FIGS. 3b-3f show the progression through time as the Si atom's motion is tracked by the red dashed line. The subregion includes the Si atom from a source material and a neighboring atom. Periodically, the Si atom exchanges lattice sites with its neighboring atom under beam irradiation. By scanning the beam over the atom neighboring the Si atom, source material is agitated, which acts to heal the graphene by moving the source material to the desired location shown by the red arrow. The placement of the beam causes the Si atom to switch places with the carbon atom by making defects in front of the Si atom. This allows the Si atom to progress through the lattice and switch positions with neighboring carbon atoms. By using the electron beam, the system manipulate atoms causing them to move to a desired location. The atom's motion (indicated by the dashed red line), was captured by the same STEM source that also induced the atoms motion. In FIG. 3, the image acquisition area is shifted slightly to compensate for sample drift and keep the target location within a field of view.

Figure 4:
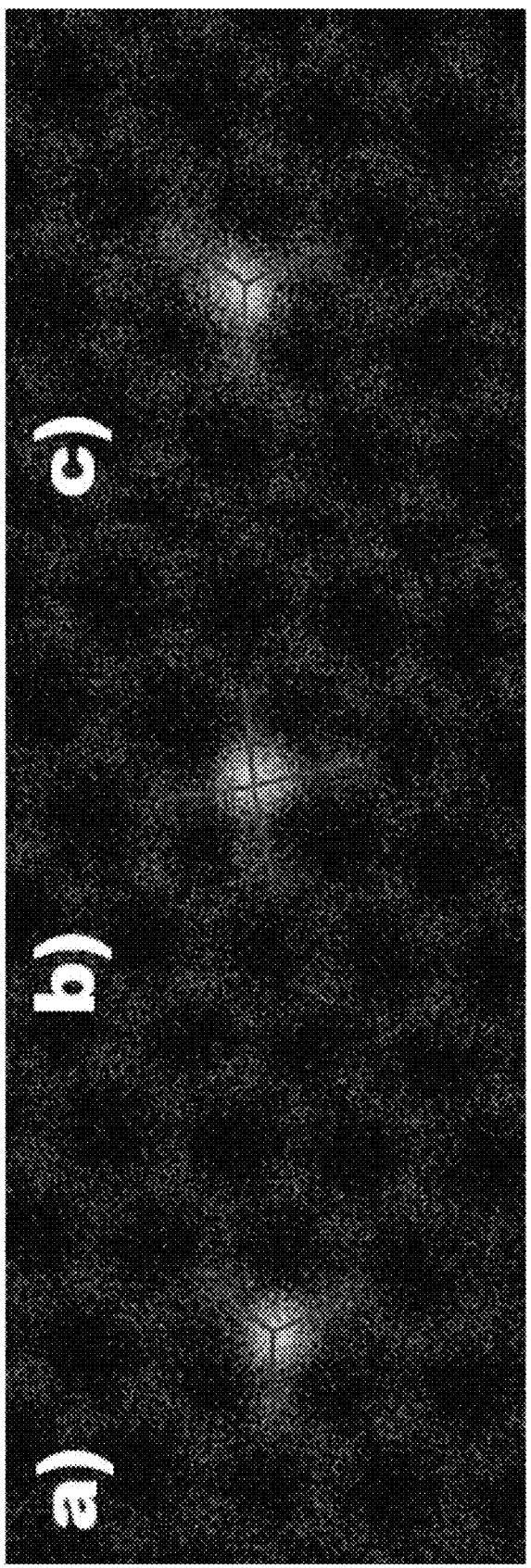
FIG. 4 shows how a silicon substitutional defect is transformed from three-fold coordinated bond to four-fold coordinated bond by loss of a carbon atom, and a conversion back to three-fold coordinated bond.

FIG. 4 shows a manipulation of atomic bonding. The Si substitutional defect is transformed from a three-fold coordinated bond configuration to a four-fold coordinated bond. By the loss of a carbon atom the Si atom is then returned to a three-fold bond. FIG. 4a shows an initial configuration. FIG. 4b shows the configuration after agitating its carbon neighbor with the electron beam. In this figure, the carbon atom is lost and the lattice restructures to find an energy minimum where the Si atom now occupies two carbon lattice sites. FIG. 4c shows the continued agitation of the Si neighbors with the electron beam, which causes a spontaneous recapturing of a carbon atom and results in the lattice reconfiguring to a three-fold coordination as shown in FIG. 4c.

Figure 5:
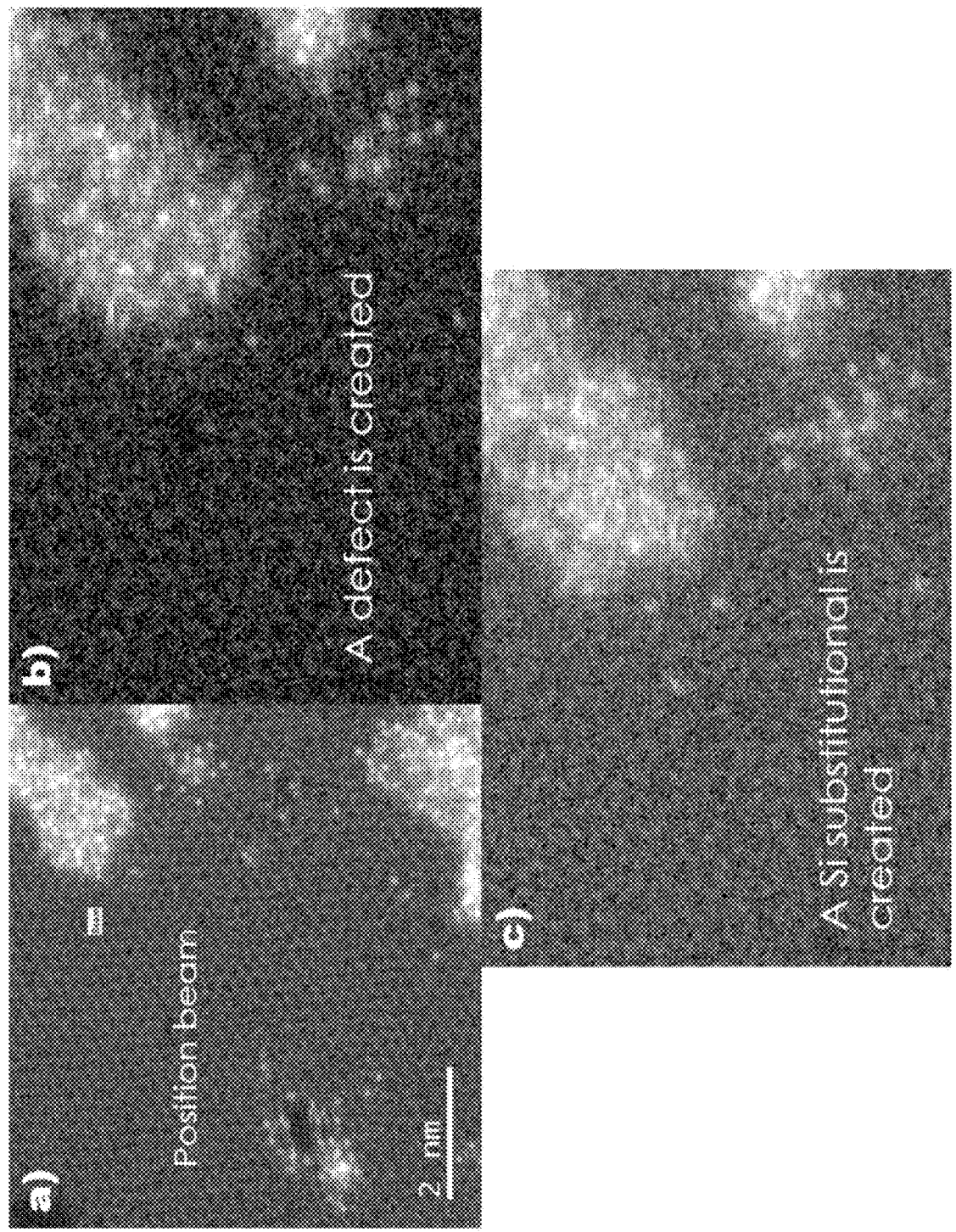
FIG. 5 illustrates the introduction of a single dopant atom into a graphene lattice.

In FIG. 5 a single dopant atom is introduced into a substrate material. Once a desired location is identified near the source material, a 100 kV electron beam creates a small defect or hole as shown in FIG. 5b. With the hole formed, the source material is agitated allowing the source beam to free the source atoms, in this example, Si and C (carbon) atoms, which promotes the lattice healing as the source atoms move to the defect region. FIG. 5c shows incorporation of the a silicon atom in the defect.

Figure 6:
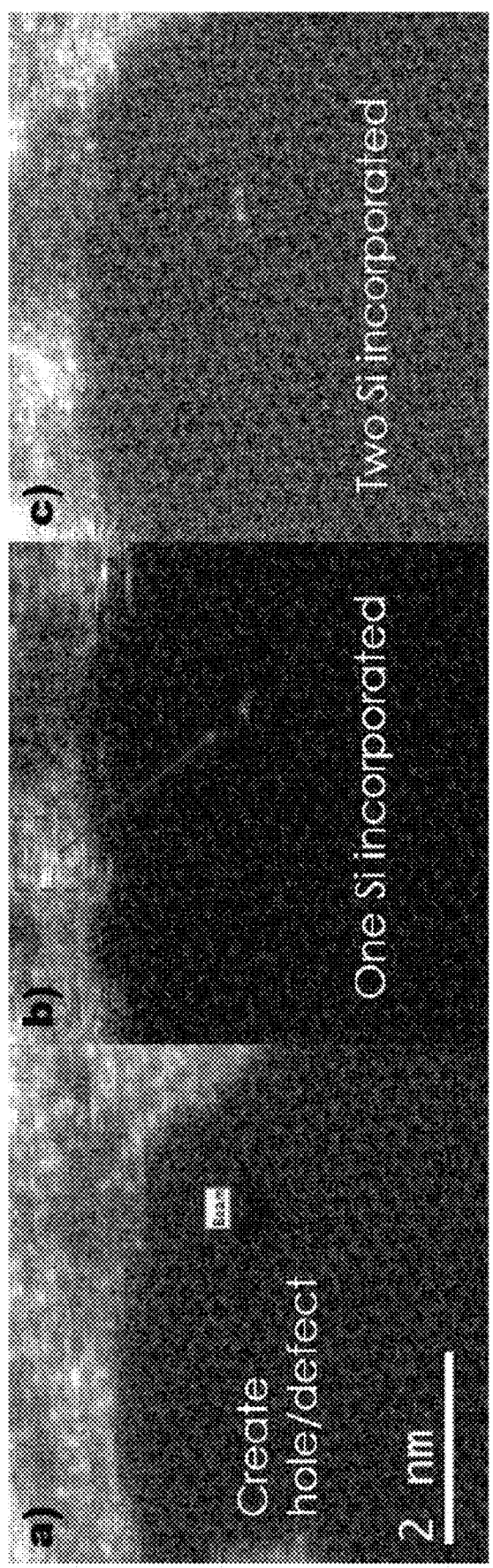
FIG. 6 illustrates an introduction of a Si dimer in a graphene lattice.

FIG. 6 illustrates a further example of mending a defect in a lattice such as in a graphene lattice. In FIG. 6, an atomic size defect is created in the graphene lattice through a focused STEM probe. The source material is agitated causing the adjacent material to sputter atoms that bond to the defect site. FIG. 6b shows the source material agitated by the electron beam by scanning over a small area. FIG. 6c shows the graphene lattice healing by incorporating the atoms sputtered from the source materials. In FIG. 6c the graphene lattice is healed using two Si substitutional atoms from the source material.

In further applications, the systems sculpts matter down to nanometer and atomic levels and creates nanometer-scale crystalline structures. The systems use a combination of the scanning transmission electron microscopy, electron beam modifications, custom beam control, and in some systems, real time feedback based on rapid identification of the crystalline order and modifications. Some systems include an aberration corrected STEM and computers (e.g., controllers and/or controlling software), as platforms for materials nanofabrication. Using custom software programs, some controllers control the location, dwell time, and raster speed of a finely focused STEM probe by applying a direct current (DC) bias to the scanning STEM coils. Using a controllable electron beam irradiation from a sub-nanometer STEM probe, the electron beam interacts with target matter in a controllable manner that physically and chemically transforms an amorphous or liquid phase precursor materials into crystalline solids.

Figure 7:
FIG. 7 shows the result of an atom-by-atom nanofabrication a writing of the text "ORNL" from an amorphous $SrTiO_3$ precursor.

In some systems, feedback is not used. FIG. 7, shows a nanofabrication result of crystalline material using beam scanning without feedback. When scanning a STEM probe through an amorphous material, in this case, strontium titanate ($SrTiO_3$), the systems epitaxially grew crystalline $SrTiO_3$ from the amorphous $SrTiO_3$ interface. By an atom-by-atom nanofabrication, the system wrote the term "ORNL", an assignee of this technology.

Figure 8:
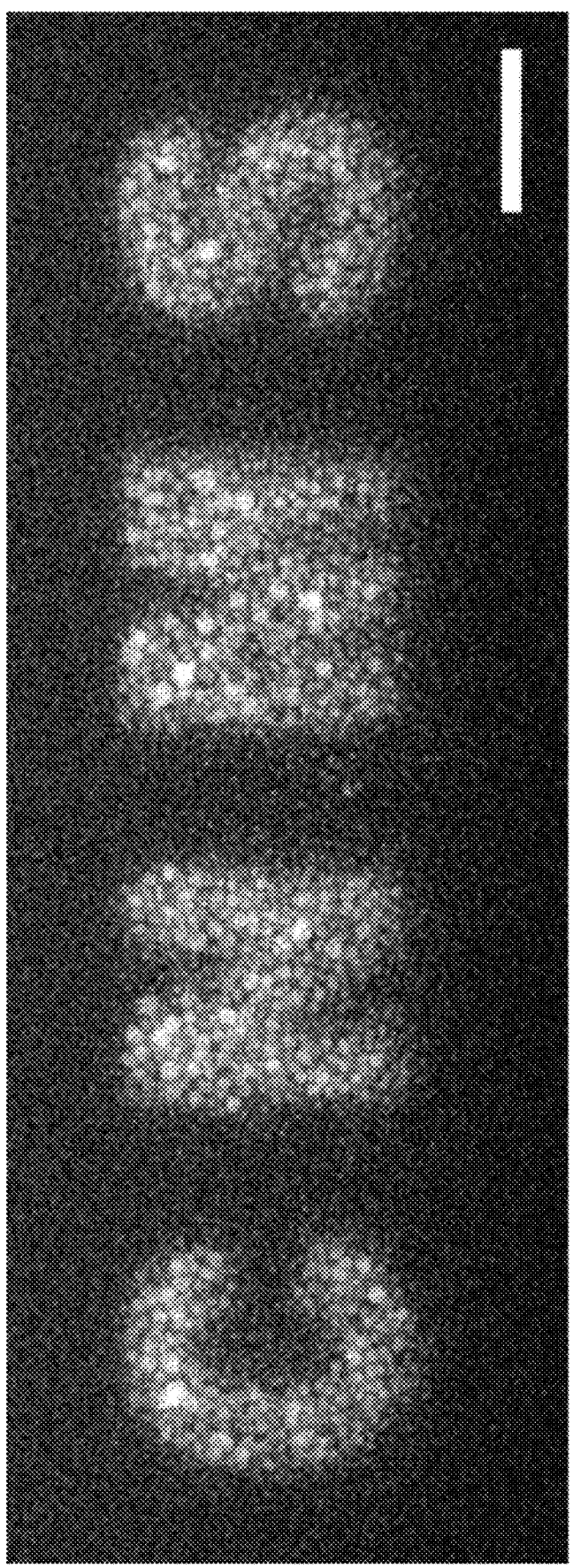
FIG. 8 is liquid phase patterning of Pd nanocrystals in the text "CNMS" through controlled electron beam irradiation from a $H_2PdCl_4$ growth solution.

The same approach patterns crystalline materials from a liquid precursor. Using a growth solution, such as $H_2PdCl_4$, for example, the growth solution is encapsulated between two electron transparent silicon nitride membranes and placed in an in situ liquid cell STEM holder. As a result of electron beam induced radiolysis, solvated electrons were generated which are highly reducing. The solvated electrons chemically reduce metallic Pd from the growth solution (e.g., $H_2PdCl_4$) and through precise control of the STEM source, the system nanofabricate structures from a liquid phase precursor as shown in FIG. 8. In FIG. 8 the liquid phase patterning of Pd nanocrystals rendered the text "CNMS" through controlled electron beam irradiation from a $H_2PdCl_4$ growth solution. The shown scale bar is 500 nm.

Using some or all of the workflow processes described herein, some systems process a feedback and use a control system described herein that guide the atomic layer by atomic layer movement of the crystal-amorphous (CA) interface (either as crystallization into the amorphous region or amorphization in a reverse direction). The system operates by scanning the electron beam parallel to the CA interface while simultaneously capturing the bright field and/or dark field signals of the STEM through a detector during the linear scans. Some systems execute a single line scan to determine the degree of local crystallinity by calculating the amplitude portion of a one-dimensional Fast Fourier Transform (FFT) of the STEM signal as a function of space. The line scan across the amorphous region results in a relatively featureless FFT, whereas a line scan across a crystalline region yields identifiable peaks corresponding to the average spacing between atomic columns.

Figure 9:
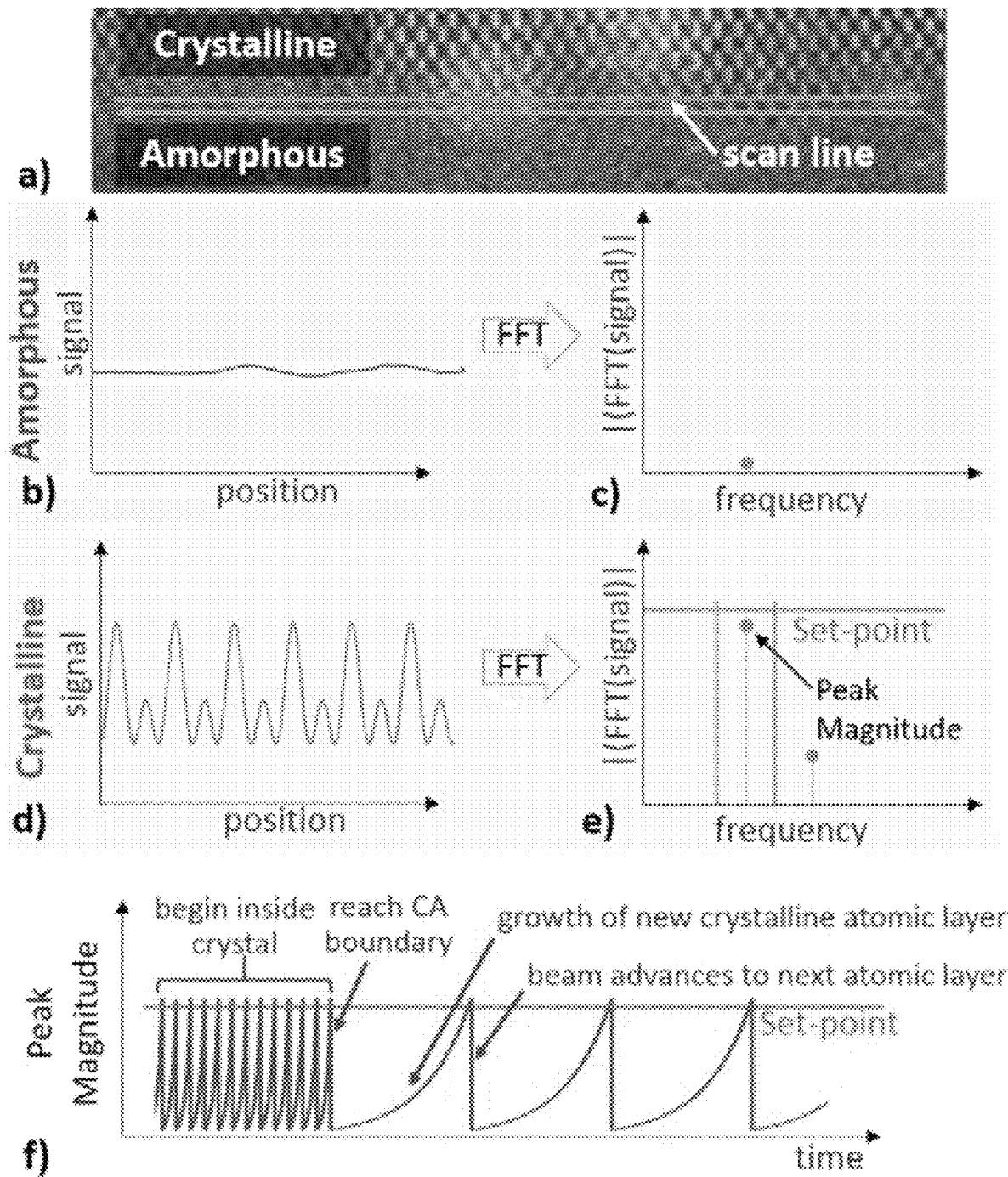
FIG. 9 is a beam directed crystallization process.

Controlled movement of the CA interface is achieved by processing the magnitude and location of the peaks as feedback to move the electron beam. That is, when the system advances the crystalline domain into the amorphous region the system: (1) repeats substantially identical line scans across the CA interface that both induce crystallization and assess the degree of local crystallinity, and (2) when the degree of crystallinity reaches a pre-determined setpoint (e.g., when an atomic layer of atoms has reordered and transformed from amorphous to crystalline), the line scan advances approximately a predetermined distance such as a half a unit cell into the amorphous region, and the process is continued. Characteristics of the process is illustrated in FIG. 9.

FIG. 9a shows an exemplary STEM image of CA interface and location of scan path during crystallization. FIG. 9b shows the spatial domain of the detector signal in the amorphous region. FIG. 9c shows the Fourier domain plots of the detector signal in the amorphous region. FIG. 9d shows the spatial domain plots of the detector signal in crystalline region. FIG. 9e shows the Fourier domain plots of the detector signal in crystalline region.

In FIGS. 9d and 9e, the amplitude of a specific Fourier peak is tracked relative to the set-point established by a user. When amplitude exceeds the set-point, the beam is advanced one-half a unit cell into the amorphous region. FIG. 9f plot of the peak amplitude from FIG. 9e as a function of time during directed crystal growth from a starting point within the crystal and while the CA front proceeds forward.

Figure 10:
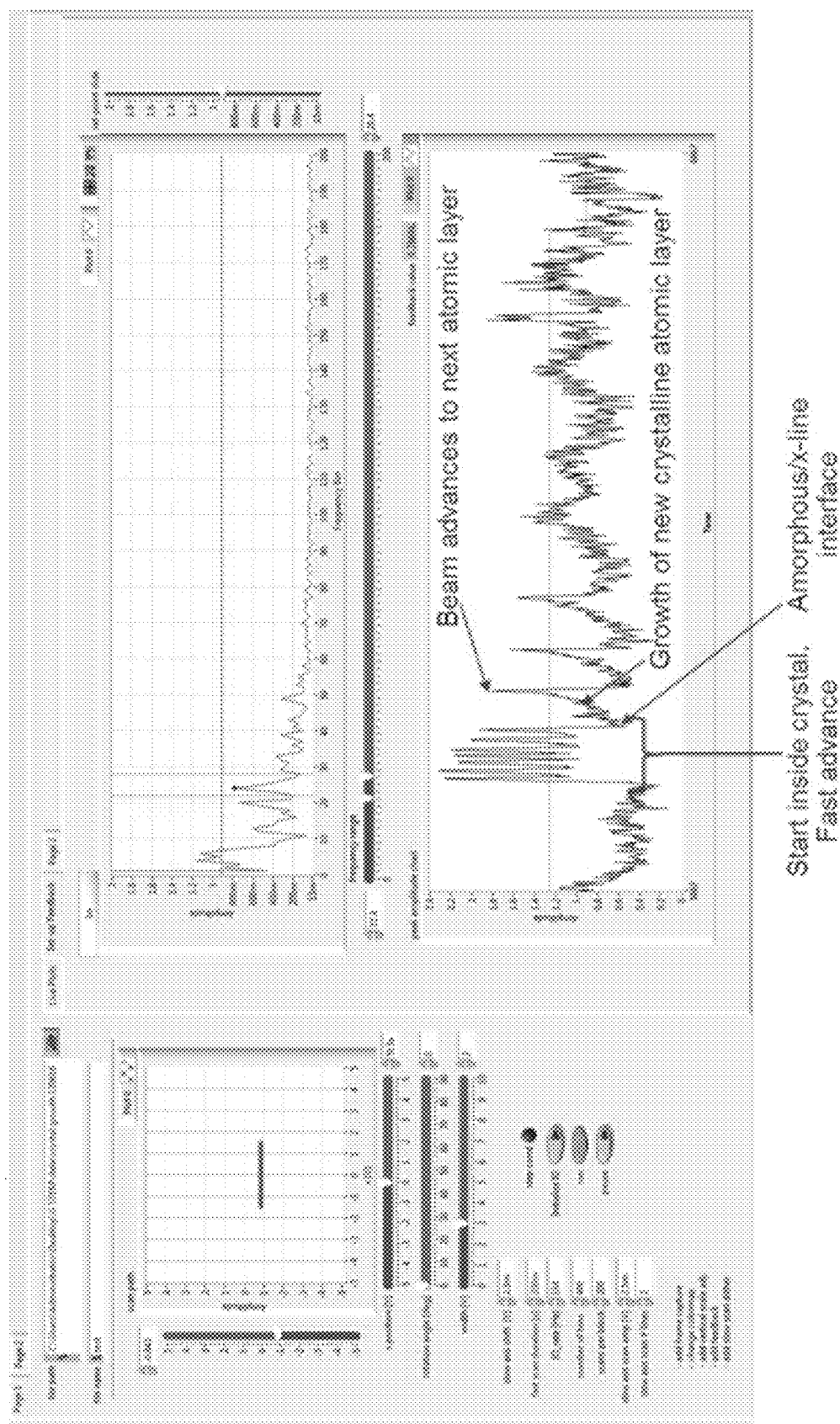
FIG. 10 is a screen shot of directed fabrication in $SrTiO_3$.

A similar procedure advance the CA interface into the crystalline region for controlled amorphization. The differences being that the beam conditions are selected to cause the crystalline portions to amorphized and feed-back causes a beam advance when peak magnitude drops below a specified set-point. This is shown by the screen shot of FIG. 10.

Figure 11:
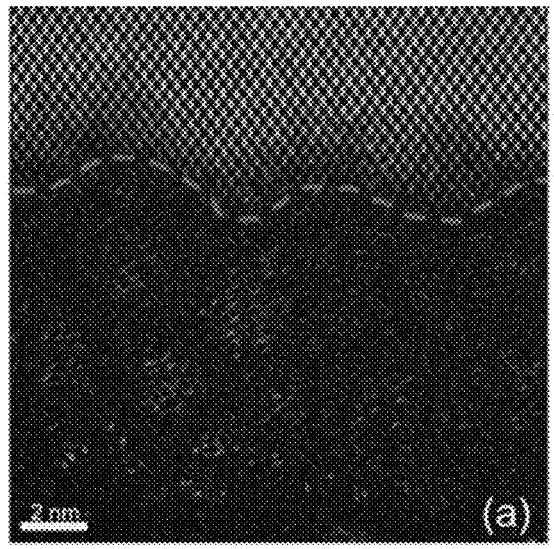
FIG. 11 is an image of beam-induced transformations in silicon using an electron beam.
Figure 11:
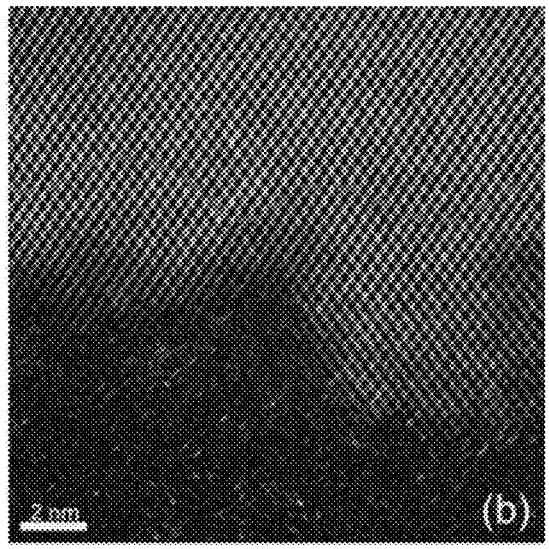
Figure 11:
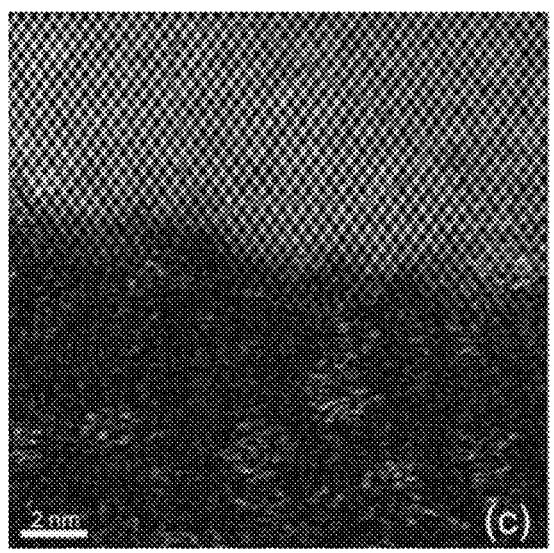
Figure 11:
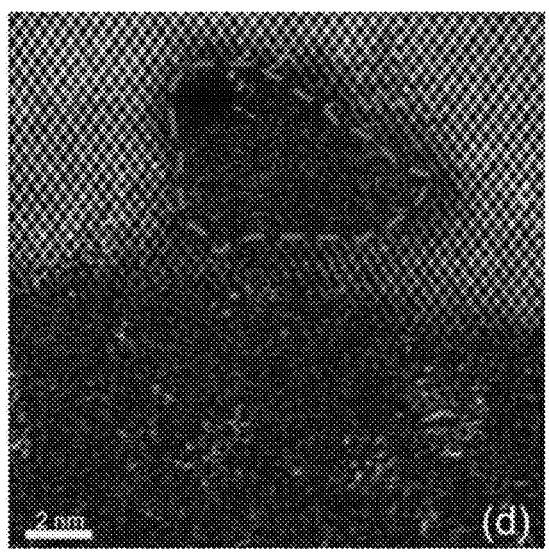

In a use case, an atomically focused beam of a STEM operating at about 200 kV guided amorphous-crystalline transformations in Si at the atomic-plane level in both forward and reverse transitions. The system caused a beam-induced motion of dopant atoms assembled in different configurations. In FIG. 11, an amorphous silicon grown on a crystalline Si substrate with Bi dopants was processed. The STEM image prior to e-beam crystallization is shown in FIG. 11a. The boundary (marked with a red dotted line) between crystalline and amorphous Si is visible, and dopant atoms can be seen within the amorphous Si matrix.

FIG. 11b shows the changes in the atomic structure after repeated scans of the image, with a slow scan direction perpendicular to the interface. There is a formation of crystalline Si extending into the amorphous region, in an apparent epitaxial registry with the substrate. By increasing the beam current to about 139 pA, compared to about a nominal 30 pA conditions used in FIGS. 11a and 11b, the system drives the transformation from crystalline Si to amorphous Si, as shown in FIGS. 11c and 11d. The increase in beam current results in an amorphization and subsequent drilling-through of crystalline Si.

The systems may also execute Si patterning over a range of beam current settings and scanning speeds and may transition between crystallizing, amorphizing, and drilling/evaporating regimes by moving across these parameters. At about 200 kV, the nominal current of the incident electron beam may be set to about 30-35 pA. At this nominal current setting and at reduced scan speeds the system crystalizes the amorphous regions of the Si. Increasing the source current to an intermediate current level of about 75-80 pA and a medium to high scan speed results in amorphization of crystalline Si. At a high current mode of about 140 pA and low to medium-high scan speeds, results in the drilling or evaporating of material.

Figure 12:
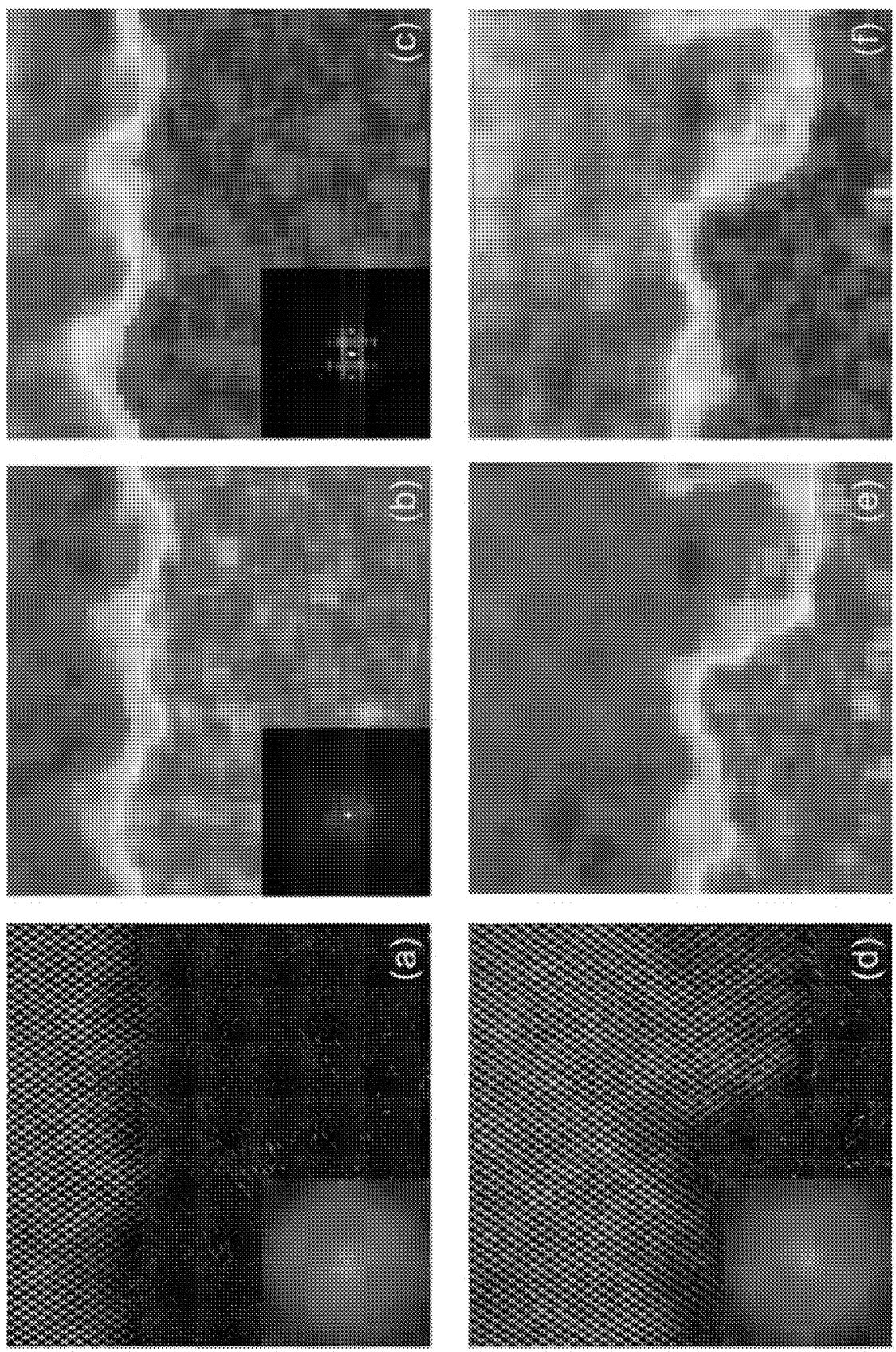
FIG. 12 is an atomic-scale tracking of a local crystallinity.

To obtain insight into the structure of the newly formed crystalline Si, a comparative crystallographic image analysis can be performed. In this process, a sliding window is scanned across the image, generating a stack of sub-images. The relevant two-dimensional structure factors are calculated, and the resulting data set is linearly unmixed using nonnegative matrix factorization. This process is suited for differentiation of dissimilar crystalline phases, to determine if the beam-crystallized Si grows with the same crystal structure as the crystal Si substrate. Unlike processes based on direct analysis of atomic positions, this process does not require high contrast images, e.g., unmixing is possible for cases where only lowest-order reciprocal lattice peaks are visible. The process begins by establishing the initial image (shown in FIG. 12a) contains only two phases and perform unmixing for two endmembers. The resulting abundance maps, along with insets showing unmixed FFT endmembers, are shown in FIGS. 12b and 12c. The analysis applies a non-negative least squares analysis in conjunction with discovered endmembers on the after-growth image (shown in FIG. 12d). The generated abundance maps show that growth regions consist of the same crystallographic phase as the substrate as shown in FIGS. 12e and 12f.

Figure 13:
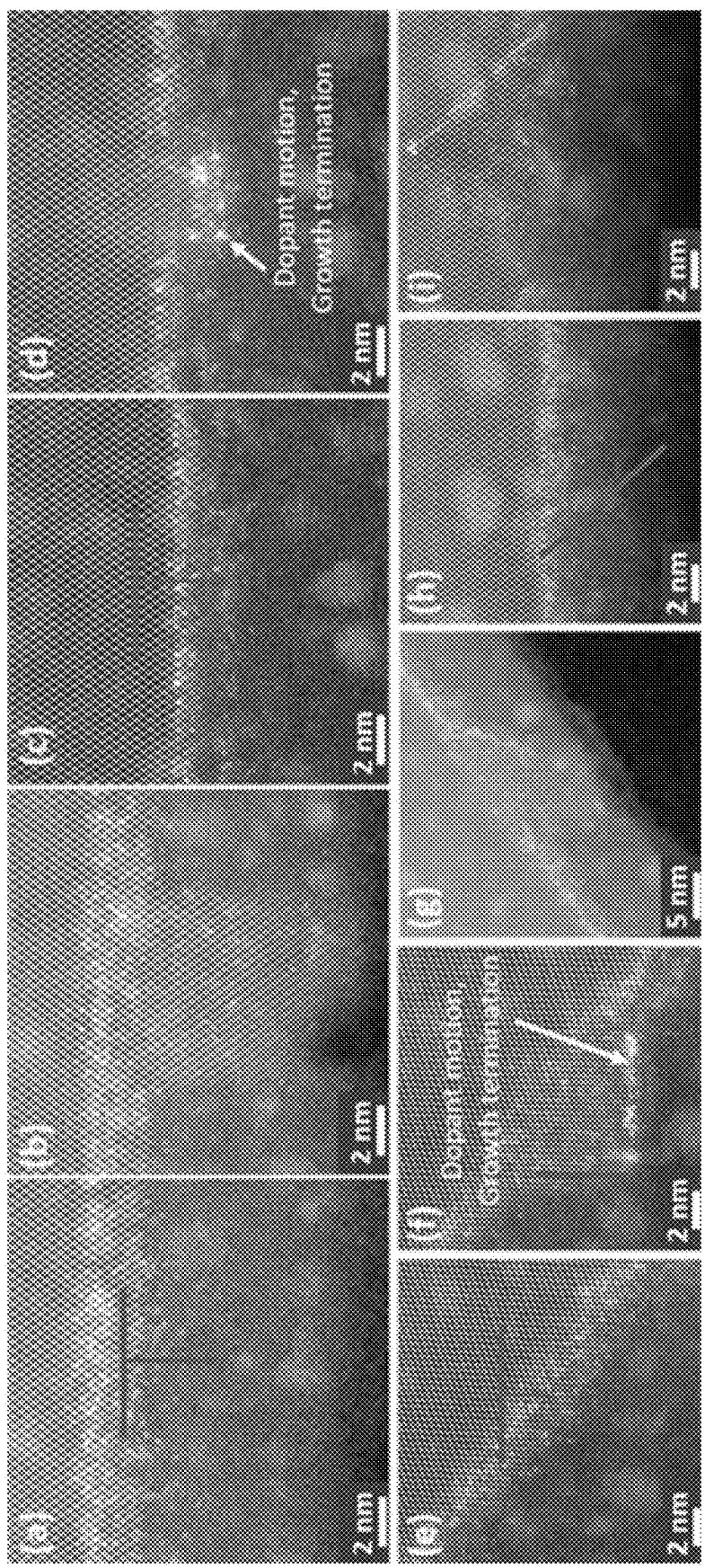
FIG. 13 is a controlled crystallization of an amorphous silicon and dopant movement. The arrows illustrate the direction of the scan axis for growth, while the red lines at the base indicate the scan along the width. The panels with red arrows are the 'before' images of growth, and the panels that follow are the after images.

To further describe the fundamental processes during beam-induced crystallization and amorphization, the fabrications were repeated for Si containing dopant atoms. In semiconductors, dopants are used obtain desired electrical characteristics. However, direct visualization of single dopants remains a technical challenge. In the processed samples, a layer of Bi atoms was deposited at the CA interface. Single Bi atoms are visible in STEM Z-contrast as shown in FIG. 13. By scanning the beam in a similar fashion as described herein to induce crystal growth, the system induces motion of bismuth atoms perpendicular to the fast-scan direction of the beam. This is demonstrated under various conditions shown in FIG. 13. FIGS. 13a and 13b show, respectively, the before and after images of crystal growth where the beam-induced growth process was initiated between the CA interface and the region of high concentration dopants, propagating in crystallographic direction. FIG. 13b shows the resulting crystal growth and the apparent movement of a few dopant atoms along the crystal growth direction. As shown, at a low concentration of dopants, crystal growth is unimpeded and allows for larger-scale structures than in the undoped case. For comparison, in FIG. 13c and FIG. 13d the beam-induced growth is initiated deeper within the crystal than the layer with high dopant concentration, and thus, a large number of dopant atoms are displaced. In this exemplary use case however, crystal growth stopped progressing after several nanometers. This may be due to the poor crystallographic compatibility between Bi and Si.

Similar behavior was exhibited in FIGS. 13e and 13f as in FIG. 13c and FIG. 13d. The crystal growth and dopant motion proceeded together and stopped when the local dopant concentration reached a critical value. However, with dopant atoms cleared out of the way in FIG. 13f, the system could induce crystal growth perpendicular to the original growth direction as shown in FIG. 13g. FIGS. 13h and 13i show that the same scanning pattern can also be used to move dopants to a deeper depth in the crystal. Notably, the dopant front appears very sharp in both cases, and no fronts form on the sides of the growing crystal. This suggests that the hopping/relaxation time for Bi atoms after being activated ('knocked') by the electron beam is closer to the scan time of an entire line in the fast-scan direction rather than a pixel in that line. A process at this timescale can be precisely controlled by the electron beam, directly illustrating the feasibility of controlled atom-by-atom motion.

To gain further insight into the observed phenomena, the process analyzed effects of the electron beam on a solid. Generally, the energy transfer between a high-energy particle and a solid includes two primary components: losses to the electronic subsystem and direct interactions between high-energy particles and nuclei (knock-on). The knock-on interaction may result in damage when the kinetic energy that can be transferred in a single collision is larger than the energy barrier to displace an atom in the solid. Notably, in amorphous materials the binding energies are broadly distributed, allowing for a broad distribution of knock-on thresholds. For sufficiently high particle energy, multiple event cascades can be initiated. Similarly, in a material with finite thickness, when the knock-on interaction occurs a few layers away from a material surface, ejection of surface atoms is possible. Additionally, the energy barrier will usually be significantly lower for surface atoms, primarily because of the reduced number of bonds.

Another model for beam-induced changes in materials includes non-equilibrium heating, when the two subsystems—atomic nuclei and electronic—develop different temperatures, thus being in non-equilibrium conditions. Depending on the temperature difference between the two subsystems, energy that is transferred to the electrons can subsequently be transferred to the lattice atoms via the electron-phonon interactions until equilibrium is reached, where it diffuses further through the atoms. This mechanism is described by the two-temperature (referred to as the 2T model). In the 2T model, the evolution of the electronic and the atomic temperatures are described separately, using a set of heat diffusion equations, one for the electronic and one for the atomic system. The energy exchange between the two subsystems depends on the temperature difference between them, and the strength of this interaction is expressed with the electron-phonon coupling parameter "g". For the case of silicon, a combination of results from irradiation experiments combined with an inelastic thermal spike model, a molecular dynamics and Digital Fourier Transform (DFT) computational and model and numerical approaches determine the values of the 2T model parameters. From this, g is calculated to be $1.8\text{-}5\times10^2$ W cm$^{-3}$ K$^{-1}$, using the known values for the lattice specific heat and conductivity, and the electronic specific heat and diffusivity.

Given the uncertainties in these parameters for amorphous solid, a process modeled the induced crystallization assuming that the electron beam creates a local temperature within a small volume of material. To explore this behavior, the process generated model where amorphous Si was deposited on crystalline silicon. The amorphous region was then heated to induced crystallization. The heated region (20 Å×10 Å×108 Å), representing the local volume heated by the beam, was initiated at the CA interface, and slowly moved into the amorphous region. Once the temperature inside the block reached about 1300 K, crystallization began in regions close to the interface and moved upwards, terminating approximately at the face, resulting in a pyramidal-like front. After about 1 ns, the 'beam' was moved 5 Å further into the amorphous region, and a block of the same size was again heated to about 1300 K. The rest of the system, which now includes half of the previously crystallized block, was maintained at 300 K. This process was repeated several times until the crystal front reach about half the size of the amorphous sample (50 Å).

Figure 14:
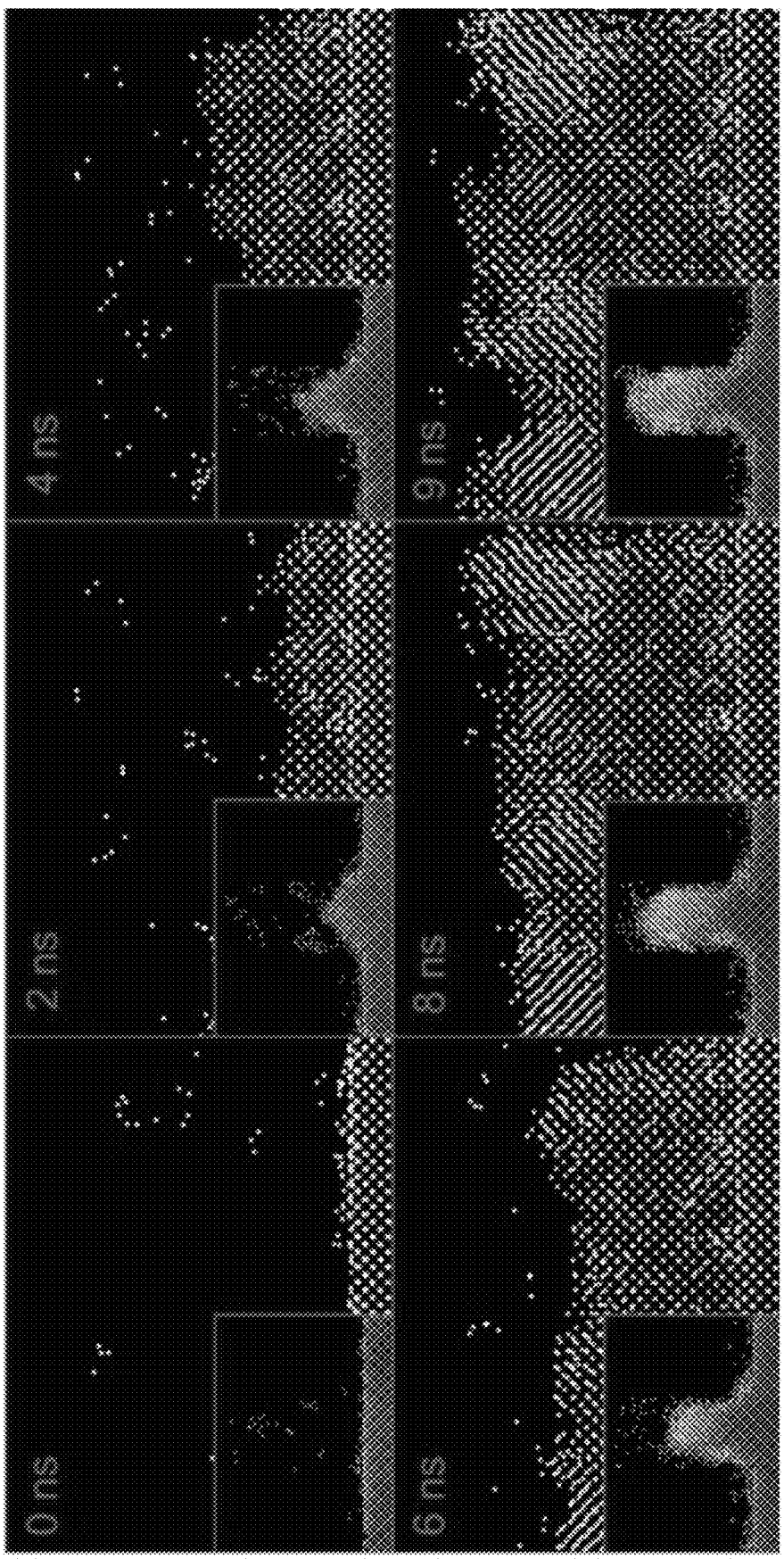
FIG. 14 is timeline showing views of crystallization front in the molecular dynamic simulation of a silicon crystallization. The main frame shows the side view, and the smaller inset frame shows the front view.

To differentiate between crystalline and amorphous phases the process executed a tetrahedral order parameter that describes the coordination state of each atom at about 20 ps intervals according to the formula:

$$q_t = 1 - \frac{3}{8}\sum_{i<j=1}^{4}\left(\cos\theta_{ij} + \frac{1}{3}\right)^2$$

where $\theta_{ij}$ comprises the angle between an atom and its two nearest neighbors. The resulting parameter is in the range between about zero, indicating an amorphous phase, and about one, indicating a crystalline phase. However, within the amorphous phase the process detected multiple small momentarily crystalline regions. For each analyzed frame, the process constructed the matrix of tetrahedral order parameters for each atom and its corresponding nearest neighbors. The process executed a k-means clustering algorithm on the first frame to train the classifier, and use it to predict phases in the subsequent simulation frames. FIG. 14 shows the application of the algorithm to simulation data, showing only atoms belonging to a crystal. This corroborates evidence that the growth belongs to the same crystalline phase as the substrate, since the process used the pre-growth data as a training set, and the growth is classified by the unsupervised algorithm as the same crystal as the original substrate.

As shown, the crystallization occurs mostly within a heated region, forming characteristic pyramidal growth pattern in the beginning, and becoming slightly wider at the top of the growth region later. Along the length of the crystallization front, FIG. 14 shows a characteristic wave-like pattern, which gets amplified as the heated region moves further away from the substrate.

The simulation, reproduces much of the behaviors, including the tendency to form triangles (pyramids) terminating at the planes. The model further offers evidence of roughening, with the brightness of the atomic columns decreasing quickly the further the observation moves from the original boundary. Further model development may include realistic time effects, since presently the timescale is in nanoseconds, as compared to experimental time frames of about ten seconds. This behavior may be linked to a higher heating rate in the model compared to the experiment, and also allows to compensate for mismatch in time scales.

The atomic manipulation of Si, an important element in industrial semiconductor fabrication, demonstrated herein, marks a significant step in atom-by-atom fabrication. Remarkably, the capability of the electron beam to crystallize, amorphize, remove material, and controllably move dopant atoms fronts, even under the limitations of microscopes designed to image materials rather manipulate matter, shows the enormous potential to shape and direct matter on the atomic level.

The real-time feedback system implemented here can be expanded to include complex forms of image analytics, e.g. switching between 'modification' and imaging modes. Here, the use of compressed sensing and related approaches can be instrumental in disambiguating low-dose non-invasive and high-dose modification regimes. Second, using a full two dimensional feedback from a fast Ronchigram detector in place of a high angle annular dark field (HAADF) intensity detection reading can provide a feedback signal that can be used to determine when a desired transformation occurred while the beams remains focused on a single location. The use of precise control systems that are capable of high-speed and high-veracity beam positioning by compensating for beam scanning nonidealities (such as phase lag and frequency dependent gains) provide further benefits. Evolution of electronic, lattice, and concentration fields and their interdependence can be considered in great detail by the disclosed systems.

Figure 15:
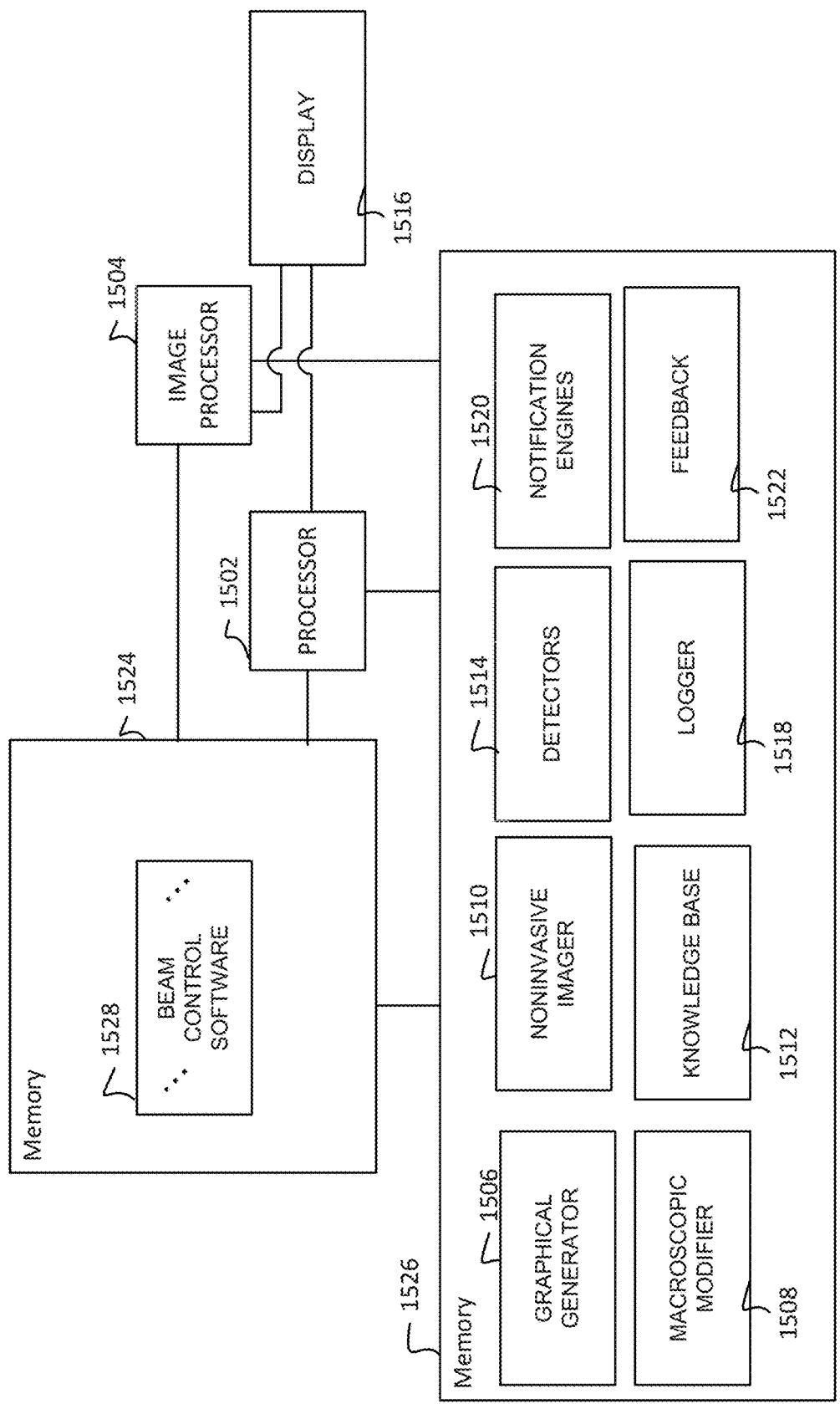
FIG. 15 is an exemplary nanometer fabrication and modification system.

FIG. 15 is a block diagram of a fully automated nanofabrication and control system that executes the systems (including process flows) and characteristics described herein and those shown in FIGS. 1-14 to fabricate and/or modify nanorobotic devices. The system comprises processors 1502 and 1504, a non-transitory computer readable medium such as a memory 1524 and 1526 (the contents of which are accessible to the processors 1502 and 1504), and an Input/output interface (I/O interface—not shown). The I/O interface connects devices and local and/or remote applications such as, for example, additional local and/or remote robotic specifications. The memory 1524 and 1526 stores instructions in a non-transitory media, which when executed by the processor or image processor 1502 or 1504, causes the nanorobotic modifications and fabrication and some or all of the functionality associated with fabricating and controlling nanorobotic devices, for example. The memory 1524 and 1526 stores software instructions, which when executed by one or both of the processors 1502 and 1504, causes the fabrication, powering, and/or control system to render functionality associated with a graphical generator 1506, the microscopic modifier 1508, the non-invasive imager 1510, the scanning profiles and knowledge base 1512, the feedback detectors 1514, the log device 1518, the notification engines 1520 (generating a visual, textual, and/or auditory signal and/or control signal alerting a user to a completed fabrication or completion of or execution of a task), the feedback generators 1522, an electron beam control device 1528 and the display 1516. In yet another alternate nanofabrication and control system, the non-transitory media provided functionality is provided through cloud storage. In this nanofabrication and control system, cloud storage provides ubiquitous access to the system's resources and higher-level services that can be rapidly provisioned over a distributed network. Cloud storage allows for the sharing of resources to achieve consistent services across many monitored devices at many local and remote locations and provides economies of scale.

The memory 1524 and 1526 and/or storage disclosed may retain an ordered listing of executable instructions for implementing the functions described above in a non-transitory computer code. The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random-Access Memory (RAM), a Read-Only Memory (ROM), an Erasable Programmable Read-Only Memory (EPROM or Flash memory), or a database management system. The memory 1524 and 1526 may comprise a single device or multiple devices that may be disposed on one or more dedicated memory devices or disposed on a processor or other similar device. An "engine" comprises a hardware processor or a portion of a program executed by a processor that executes or supports nanorobotic fabrications, powering, and/or nanofabrication control. When functions, steps, etc. are said to be "responsive to" or occur "in response to" another function or step, etc., the functions or steps necessarily occur as a result of another function or step, etc. It is not sufficient that a function or act merely follow or occur subsequent to another. The term "substantially" or "about" encompasses a range that is largely (anywhere a range within or a discrete number within a range of ninety-five percent and one-hundred and five percent), but not necessarily wholly, that which is specified. It encompasses all but an insignificant amount.

The disclosed nanorobotic devices and processes are capable of fabricating and modifying matter on molecular and atomic scales. The disclosed systems (e.g., that may execute a single atom or a small atomic group processing or atom-by-atom fabrication. The systems create controllable atomic assemblies in two and three dimensions using a combination of the scanning transmission electron microscopy, electron beam modifications, custom beam control, and/or real time feedback. Some real time feedback is based on single point feedback, a diffraction feedback, a sub-image and/or the analysis of a chemical spectroscopy signal feedback. Some systems develop and apply cause-and-effect rules stored in memory to induce transformations and establish a knowledge base applied algorithm that may be applied on a limited or commercial scale. The systems apply the knowledge base algorithms and processed described herein to render materials structures automatically.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A non-transitory computer-readable medium having stored thereon a plurality of software instructions that, when executed by a processor, causes:
   identifying, by a non-invasive imager, a local atomic structure, distribution of vacancies, and dopant atoms;
   modifying, by a microscopic modifier, the local atomic structure, via an electron beam irradiation
   storing, by a knowledge base, a plurality of cause-and-effect relationships based on a non-invasive imaging and a plurality of electron scans;
   detecting, by a plurality of detectors, changes in the local atomic structure induced by the electron irradiation; and
   fabricating, a modified atomic structure by a beam control software and feedback, through a sequentially executed electron beam motion affected by the feedback.

2. The non-transitory computer-readable medium of claim 1 where the identifying comprises acquiring multiple images and sample alignments.

3. The non-transitory computer-readable medium of claim 1 where the modifying comprises a deposition of microscopic contacts.

4. The non-transitory computer-readable medium of claim 1 where the modifying comprises a formation through lithography.

5. The non-transitory computer-readable medium of claim 1 where the modifying comprises a cleaning through an ion irradiation.

6. The non-transitory computer-readable medium of claim 1 where the modifying comprises a deposition via an evaporation.

7. The non-transitory computer-readable medium of claim 1 where the modifying comprises generating an atomic assembly.

8. The non-transitory computer-readable medium of claim 1 where knowledge base is based on a predetermined scanning trajectory.

9. The non-transitory computer-readable medium of claim 1 further comprising correlating, by the knowledge base, changes in the local atomic structure with the feedback.

10. The non-transitory computer-readable medium of claim 1 where the fabricating occurs by a point-by-point, a line-by-line, or a pre-defined electron scan stored in a memory.

11. A system comprising
a non-invasive imager that identifies a local atomic structure, distribution of vacancies, and dopant atoms;
a microscopic modifier that modifies the local atomic structure via an electron beam irradiation
a knowledge base storing a plurality of cause-and-effect relationships based on a non-invasive imaging and a plurality of electron scans;
a plurality of detectors detecting changes in the local atomic structure induced by the electron irradiation; and
a beam control software and feedback that modifies the local atomic structure through a sequentially executed electron beam motion affected by the feedback.

12. The system claim 11 where the non-invasive imager acquires multiple images and sample alignments.

13. The system claim 11 where the microscopic modifier is configured to execute a deposition of microscopic contacts.

14. The system claim 11 where the microscopic modifier is configured to execute a formation through lithography.

15. The system claim 11 where the microscopic modifier is configured to execute a cleaning through an ion irradiation.

16. The system claim 11 where the microscopic modifier is configured to execute a deposition via an evaporation.

17. The system claim 11 where the microscopic modifier is configured to generate an atomic assembly.

18. The system claim 11 where the knowledge base stores data representing predetermined scanning trajectories.

19. The system claim 11 where the knowledge base stores instructions that correlates changes in the local atomic structure with the feedback.

20. The system claim 11 where the beam control software is configured to fabricate atomic assemblies by a point-by-point, a line-by-line, and a pre-defined electron scan instruction stored in a memory.

* * * * *